(12) United States Patent
Mori et al.

(10) Patent No.: US 8,008,602 B2
(45) Date of Patent: Aug. 30, 2011

(54) ELECTROSTATIC CHUCK HEATER

(75) Inventors: Yutaka Mori, Nagoya (JP); Akiyoshi Hattori, Nagoya (JP); Takeru Torigoe, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 1076 days.

(21) Appl. No.: 11/879,740

(22) Filed: Jul. 18, 2007

(65) Prior Publication Data

US 2008/0047952 A1  Feb. 28, 2008

(30) Foreign Application Priority Data

Jul. 19, 2006 (JP) .................. 2006-196801
Jul. 13, 2007 (JP) .................. 2007-184677

(51) Int. Cl.
*H05B 3/68* (2006.01)
*H05B 3/18* (2006.01)
*C23C 16/00* (2006.01)

(52) U.S. Cl. ............ 219/444.1; 219/390; 118/728
(58) Field of Classification Search .............. None
See application file for complete search history.

(56) References Cited

U.S. PATENT DOCUMENTS

| 6,617,514 B1 | 9/2003 | Ushikoshi et al. | |
|---|---|---|---|
| 6,731,496 B2 * | 5/2004 | Hiramatsu et al. | 361/321.2 |
| 2004/0173598 A1 * | 9/2004 | Ito | 219/444.1 |
| 2005/0011878 A1 * | 1/2005 | Ito et al. | 219/444.1 |
| 2005/0029244 A1 * | 2/2005 | Ito et al. | 219/444.1 |
| 2006/0073349 A1 | 4/2006 | Aihara et al. | |
| 2006/0169688 A1 * | 8/2006 | Mori et al. | 219/444.1 |

FOREIGN PATENT DOCUMENTS

| EP | 1 119 041 A2 | 7/2001 |
|---|---|---|
| EP | 1 672 679 A2 | 6/2006 |
| JP | 11-012053 A1 | 1/1999 |

OTHER PUBLICATIONS

James Intrater, "The Challenge of Bonding Metals to Ceramics," Machine Design, Penton, Media, Cleveland, OH, vol. 61, No. 24, Nov. 23, 1989, pp. 95-100.

* cited by examiner

*Primary Examiner* — Joseph M Pelham
(74) *Attorney, Agent, or Firm* — Burr & Brown (57) ABSTRACT

An electrostatic chuck heater is provided including a base which is formed by applying conductive paste containing a binder to upper and lower surfaces of an alumina sintered body to print an electrostatic electrode and heater electrode, calcining the alumina sintered body, arranging alumina powder above the electrostatic electrode and alumina powder below the heater electrode, and pressing the alumina powder and alumina sintered body in the above state for pressure sintering. The diffusion area ratio of the conductive material near the electrostatic electrode in the dielectric layer is set to not more than 0.25%.

4 Claims, 7 Drawing Sheets

ELECTROSTATIC CHUCK HEATER

CROSS-REFERENCE TO RELATED APPLICATION

This application is based upon and claims the benefit of priority from Japanese Patent Application No. 2006-196801 filed on Jul. 19, 2006, and No. 2007-184677, filed on Jul. 13, 2007; the entire contents of which are incorporated herein by reference.

BACKGROUND OF THE INVENTION

1. Field of the Invention

The present invention relates to a coulomb-type electrostatic chuck heater.

2. Description of the Related Art

In manufacturing semiconductor devices and the like, a coulomb-type electrostatic chuck heater has hitherto been used in some cases.

This electrostatic chuck heater includes a base made of ceramic; an electrostatic electrode and a heater electrode disposed in the base; power supply members connected to the electrostatic and heater electrodes; and various peripheral members (for example, see Japanese Patent Laid-open Publication No. 11-12053). The upper surface of the base is formed as a substrate holding surface on which a substrate such as a wafer is placed. Part of the base between the electrostatic electrode and the substrate holding surface is formed as a dielectric layer; and part of the base between the electrostatic electrode and the heater electrode is formed as a substrate layer; and part of the base between the heater electrode and the lower surface of the base is formed as a supporting layer.

SUMMARY OF THE INVENTION

An example of a manufacturing method of the base constituting the electrostatic chuck heater is described below. In this manufacturing method, the base constituting the electrostatic chuck heater is placed upside down for production. Specifically, in a general electrostatic chuck heater, the dielectric layer, substrate layer, and supporting layer are arranged in this order from the top. However, at the time of manufacturing, the dielectric layer is arranged in the bottom, and the substrate layer is formed on the dielectric layer. The supporting layer is then formed on the substrate layer to manufacture the base, and the base is reversed. Hereinafter, the manufacturing procedure is briefly described.

First, a plate-shaped first alumina sintered body which serves as the dielectric layer, a green sheet which serves as the substrate layer, and a second alumina sintered body which serves as the supporting layer are prepared. The first and second alumina sintered bodies are produced by hot-pressing.

Secondly, the first alumina sintered body is placed upside down with the rear surface thereof up, and the electrostatic electrode is formed on the rear surface. The green sheet is placed on the electrostatic electrode, and the heater electrode is formed on the green sheet. The second alumina sintered body is placed on the heater electrode. The first and second alumina sintered bodies and green sheet are sintered by hot pressing while being vertically pressurized to be integrated, thus producing the base. Finally, the power supply members and peripheral members are attached to the base to complete the electrostatic chuck heater.

However, in the aforementioned conventional electrostatic chuck heater, since the portions serving as the dielectric layer and supporting layer are formed by sintering the alumina sintered bodies twice, size of crystal grains in the alumina sintered bodies tends to be large. Accordingly, when this conventional electrostatic chuck heater is used as a coulomb-type electrostatic chuck heater, there is a problem that the chucking and de-chucking response of a substrate placed on the surface of the base is degraded at high temperature because of the low volume resistivity of the dielectric layer while the chucking and de-chucking response of a substrate is not bad at room temperature.

An object of the present invention is to provide an electrostatic heater which is excellent in chucking and de-chucking response of a substrate even at high temperature.

To achieve the aforementioned object, an electrostatic chuck heater according to the present invention includes: a base composed of an alumina sintered body; an electrostatic electrode which is embedded in upper part of the base and contains a conductive material; and a heater electrode which is embedded in lower part of the base and contains a conductive material. The base includes: a dielectric layer between the electrostatic electrode and an upper surface of the base; a substrate layer between the electrostatic electrode and heater electrode; and a supporting layer between the heater electrode and a lower surface of the base. A diffusion area ratio of the conductive material of the dielectric layer near the electrostatic electrode is set not more than 0.25% by applying a conductive paste containing a binder to print the electrostatic electrode on an upper surface of the alumina sintered body to be the substrate layer; applying a conductive paste containing a binder to print the heater electrode on a lower surface of the alumina sintered body; calcining the alumina sintered body; placing alumina powder above the electrostatic electrode and below the heater electrode; and hot-press sintering the stack of the alumina powder and the sintered body.

The electrostatic chuck heater according to the present invention has the following effects.

1) The portion serving as the dielectric layer is formed by sintering the alumina powder only once, and the crystal grains can be prevented from increasing in size. Accordingly, the volume resistivity of the dielectric layer can be maintained high, and in the case where the electrostatic chuck heater 1 is used as a coulomb type, the chucking and de-chucking response of the substrate at high temperature can be improved.

2) The portion of the base serving as the dielectric layer is formed by carrying out pressure-forming for alumina powder and then carrying out pressure sintering for the same. Accordingly, the conductive material in the electrostatic electrode may diffuse into the alumina powder through the binder of the conductive paste during the sintering process. However, in the present invention, the alumina sintered body serving as the substrate layer is subjected to calcining after the conductive paste is applied thereto. The binder in the conductive paste is evaporated by the calcining, and the conductive material in the electrostatic electrode is therefore prevented from diffusing into the alumina powder. Accordingly, the reduction in volume resistivity of the dielectric layer can be prevented. Moreover, when the electrostatic chuck heater of the present invention is used as a coulomb type, the chucking and de-chucking response of a substrate at high temperature is improved, and the electrostatic chuck heater can be very suitably used.

BRIEF DESCRIPTION OF THE DRAWINGS

FIGS. 3A to 3C are cross-sectional views showing a procedure to produce a base of the electrostatic chuck heater according to the embodiment.

DETAILED DESCRIPTION OF THE INVENTION

Figure 1:
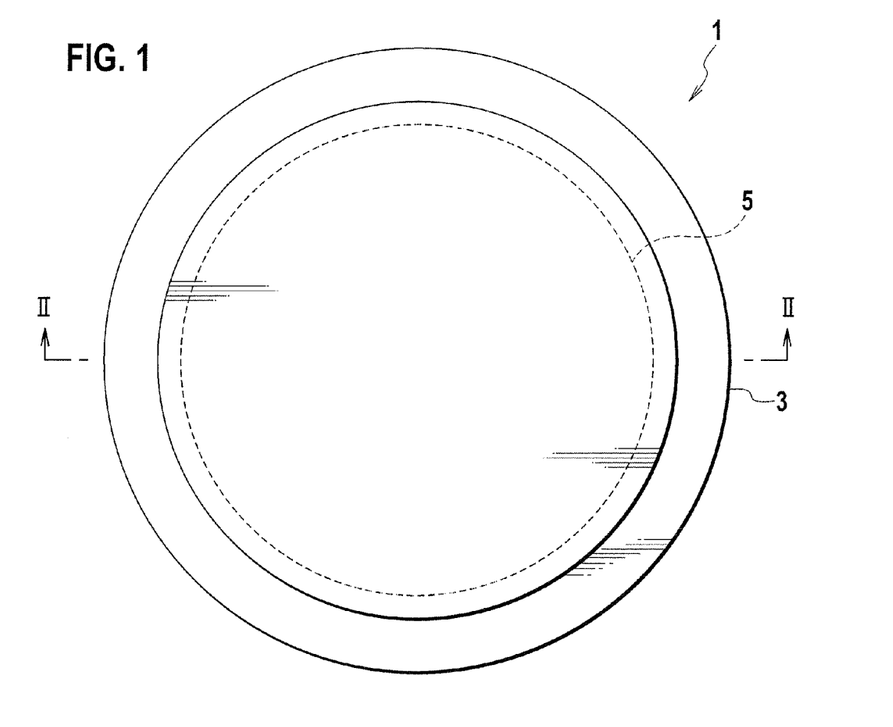
FIG. 1 is a top view showing an electrostatic chuck heater according to the embodiment of the present invention.
Figure 2:
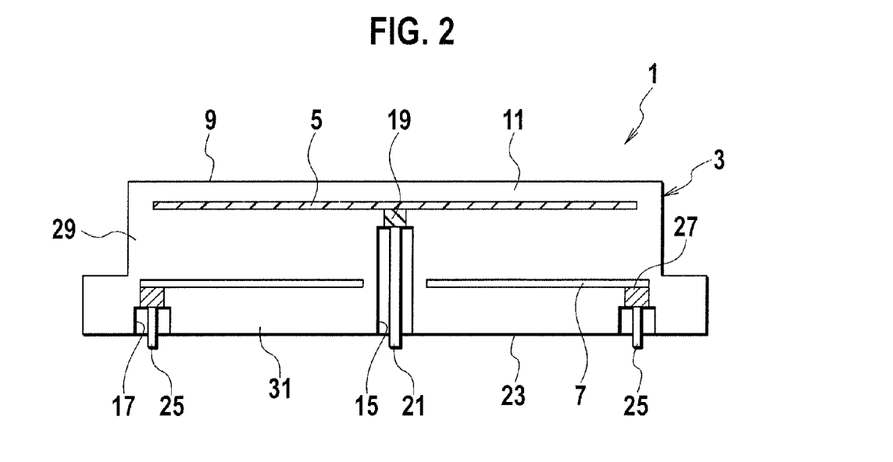
FIG. 2 is a cross-sectional view taken along a line II-II of FIG. 1.

Hereinafter, a description is given of an embodiment of the present invention.
[Electrostatic Chuck]
FIG. 1 is a top view showing an electrostatic chuck heater according to the embodiment of the present invention. FIG. 2 is a cross-sectional view taken along a line II-II of FIG. 1.

As shown in FIGS. 1 and 2, an electrostatic chuck heater 1 according to the embodiment of the present invention includes: a base 3 composed of an alumina sintered body; an electrostatic electrode 5 embedded in upper part of the base 3; and a heater electrode 7 embedded in lower part of the base 3. In this embodiment, the description is given of the electrostatic chuck heater including the heater electrode 7, but the present invention can be applied to an electrostatic chuck not including the heater electrode 7.
[Base]
The base 3 is formed into a substantially disk shape as shown in FIGS. 1 and 2. The upper surface (front surface) of the base 3 is formed as a substrate holding surface 9 on which a substrate such as a wafer is placed.

Part of the base 3 between the electrostatic electrode 5 and substrate holding surface 9 is formed as a dielectric layer 11. Part of the base 3 between the electrostatic electrode 5 and heater electrode 7 is formed as a substrate layer 29. Part of the base 3 between the heater electrode 5 and the lower surface (rear surface) of the base 3 is formed as a supporting layer 31. These dielectric layer 11, substrate layer 29, and supporting layer 31 are integrally formed.
[Electrostatic Electrode]
As shown in FIGS. 1 and 2, the electrostatic electrode 5, which has a disk shape with a diameter smaller than an outer diameter of the substrate 3, is embedded in the upper part of the base 3. This electrostatic electrode 5 contains tungsten or tungsten carbide. The electrostatic electrode 5 may be formed by printing with conductive paste containing powder of tungsten metal or tungsten carbide, which is a conductive material. The shape of the electrostatic electrode 5 is not limited to the disk and may be a mesh shape, comb shape, round shape, or the like. In the vicinity of the electrostatic electrode 5 in the dielectric layer 11, a diffusion area ratio of particles of the conductive material (for example, tungsten or tungsten carbide) contained in the electrostatic electrode 5 is not more than 0.25% as described later.

As shown in FIG. 2, in the center of the base 3, an accommodation hole 15 extending upward from a lower surface 23 of the base 3 is formed, and in the accommodation hole 15, an electrostatic electrode power supply member 21 is provided. An upper end of the electrostatic electrode power supply member 21 is connected to the electrostatic electrode 5 through a connection member 19. When voltage is applied from the electrostatic electrode power supply member 21 to the electrostatic electrode 5 through the connection member 19, an electrostatic attraction force (Coulomb force) occurs in the dielectric layer 11 of the base 3, and a substrate such as a wafer is adsorbed onto the substrate holding surface 9 of the base 3. The upper end of the electrostatic electrode power supply member 21 may be directly connected to the electrostatic electrode 5 without the connection member 19.
[Heater Electrode]
The heater electrode 7 may be formed by printing with conductive paste. The conductive paste contains one of powders of tungsten and tungsten carbide and a binder.

Figure 3A:
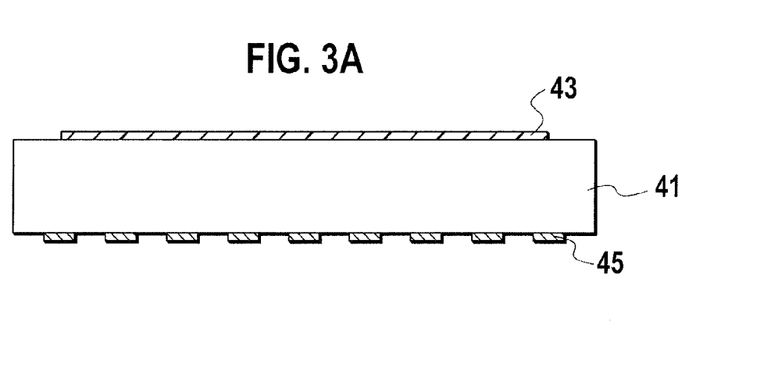
FIG. 3A being a cross-sectional view of an alumina sintered body with conductive paste applied to each side thereof.

As shown in FIG. 2, the heater electrode 7 is arranged in lower part of the base 3, or specifically, below the electrostatic electrode 5. Accommodation holes 17 extending upward from the lower surface 23 of the base 3 are formed, and heater electrode power supply members 25 are provided in the accommodation holes 17. Upper ends of the heater electrode power supply members 25 are connected to the heater electrode 7 through connection members 27. When voltage is applied from the heater electrode power supply members 25 to the heater electrode 7 through the connection members 27, the heater electrode 7 heats and supplies heat to the substrate placed on the substrate holding surface 9. The upper ends of the heater electrode power supply members 25 may be directly connected to the heater electrode 7 without the connection members 27.
[Manufacturing Method of Electrostatic Chuck Heater]
A description is given of a procedure to manufacture the electrostatic chuck heater according to this embodiment using FIGS. 3A to 3C.
<Preparation and Calcining of Alumina Sintered Body>
First, as shown in FIG. 3A, an alumina sintered body 41 which serves as the substrate layer 29 of the base 3 is prepared. Conductive pastes 43 and 45 are then applied to front and rear surfaces (upper and lower surfaces) of the alumina sintered body 41 to form the electrostatic electrode 5 on the front surface of the alumina sintered body 41 and the heater electrode 7 on the rear surface of the same.

The conductive paste 43 used to form the electrostatic electrode 5 contains powder of tungsten (W) or tungsten carbide (WC), which is the conductive material, and a binder.

By calcining the alumina sintered body 41 with the conductive pastes 43 and 45 applied thereto, the binder in the conductive pastes 43 and 45 is evaporated to the outside atmosphere. The calcination is carried out in a non-oxidizing atmosphere where the conductive material is not oxidized, such as in inert gas or in vacuum.

<Pressing and Sintering of Alumina Powder>

The method of preparing the alumina powder is, for example, as follows. As ceramic raw powder, high-purity alumina powder (for example, 99.7%) and MgO raw powder as a sintering agent are used. This ceramic raw powder is added with polyvinyl alcohol (PVA) as a binder, water, a dispersant, and the like and then mixed by a trommel for a predetermined period of time (for example, 16 hours) to prepare slurry. The amount of PVA mixed is, for example, 2 wt %. The obtained slurry is sprayed and dried using a spray drier, thus obtaining granulated alumina powder.

Figure 3B:
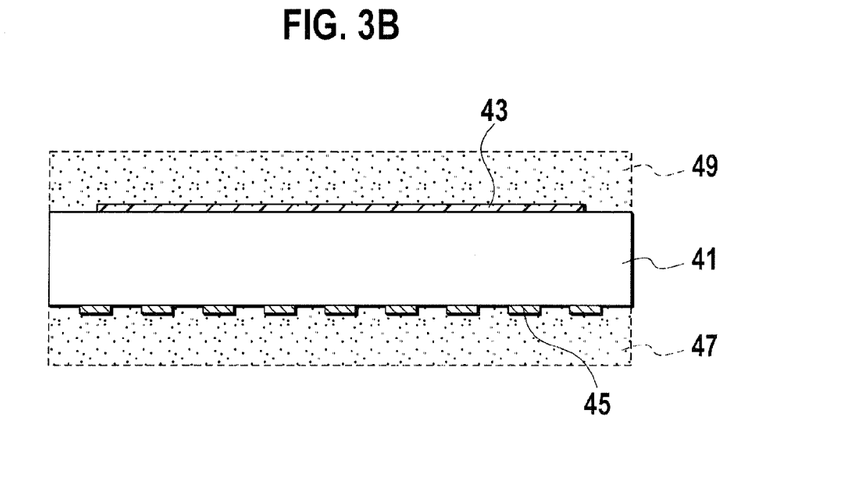
FIG. 3B being a cross-sectional view of the alumina sintered body with alumina powder arranged on each side.
Figure 3C:
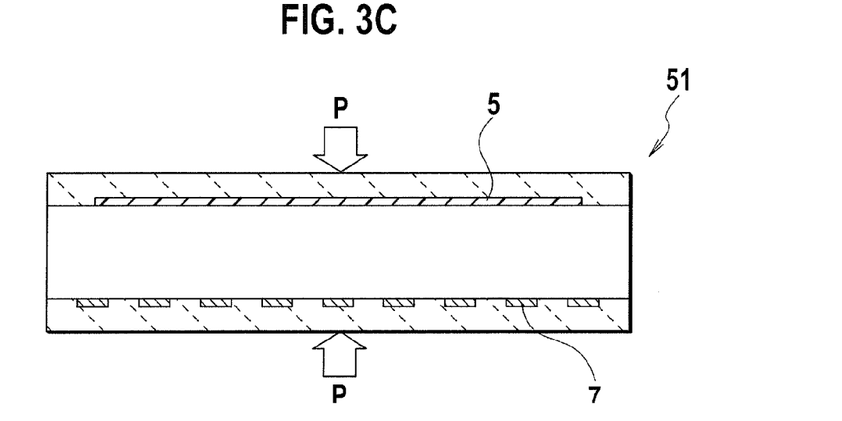
FIG. 3C being a cross-sectional view of the alumina sintered body and alumina powder pressurized and sintered.

Next, as shown in FIG. 3B, alumina powder 47, which is prepared in the aforementioned manner, is accommodated in a not-shown mold, and the alumina sintered body 41 with the conductive pastes 43 and 45 applied thereto is placed on the alumina powder 47. On the alumina sintered body 41, alumina powder 49, which is prepared in the aforementioned manner, is accommodated. The alumina powders 47 and 49 are arranged on the both sides of the alumina sintered body 41 in this manner, and the alumina powders 47 and 49 and alumina sintered body 41 are pressed with a pressure P in this state as shown in FIG. 3C to form an alumina body 51. The alumina body 51 is then subjected to pressure sintering in a non-oxidizing atmosphere. By this pressure sintering, the alumina body 51 can be formed into an alumina sintered body.

Thereafter, the surface of the alumina sintered body is subjected to plane grinding with a diamond wheel to adjust the thickness of the alumina sintered body. Furthermore, the side surface of the alumina sintered body is ground, and necessary drilling and the like are carried out to complete the base 3 of the electrostatic chuck heater 1.

In this embodiment, it is preferable that the binder in the alumina powders 47 and 49 is evaporated by calcining the granulated alumina powder at a temperature of not less than 450° C. in oxidizing atmosphere before the granulated alumina powder are used as the alumina powders 47 and 49 for the body. Preferably, the maximum calcining temperature is 1400 to 1500° C. Setting the calcining temperature higher than 1500° C. may cause binding accompanied with sintering and the like in the alumina powders.

According to the embodiment of the present invention, the following effects can be obtained.

1) The portion which serves as the dielectric layer 11 is formed by sintering the alumina powder 49 only once, so that the crystal grains are prevented from increasing in size. Accordingly, the dielectric layer 11 can be maintained with a high volume resistivity, and in the case where the electrostatic chuck heater 1 is used as a coulomb type, the chucking and de-chucking response of a substrate at high temperature can be improved.

2) The portion of the base 3 which serves as the dielectric layer 11 was conventionally formed by carrying out pressure forming for the alumina powder 49 and then baking the same. Accordingly, the conductive material (tungsten or tungsten carbide) in the electrostatic electrode 5 could diffuse into the alumina powder 49 through the binder of the conductive paste 43. However, in this embodiment, the alumina sintered body 41 with the conductive paste printed thereon is subjected to calcining, and the binder in the conductive paste 43 is evaporated and removed. This prevents the conductive material in the electrostatic electrode 5 from diffusing into the alumina powder 49 and can prevent the reduction in volume resistivity of the dielectric layer 11. When the electrostatic chuck heater 1 is used as a coulomb type, the dielectric layer 11 has high volume resistivity at high temperature, and the chucking and de-chucking response of a substrate is improved. The electrostatic chuck heater 1 can be therefore used very suitably.

3) In this embodiment, the electrostatic electrode 5 and heater electrode 7 are provided in the base 3. In some cases, the base 3 includes through-holes vertically extending so that lifter pins and the like are inserted therethrough, and in the both electrodes 5 and 7, through-holes are formed so as to correspond to the through-holes of the base 3.

According to the conventional art, plurality of alumina sintered bodies or green-sheets were pressed to form the base, and it was difficult to align the electrostatic electrode 5 and heater electrode 7. In order to ensure the insulation distance between the electrostatic electrode 5 and heater electrode 7, taking into consideration misalignment of the through-holes of the electrodes 5 and 7 and the base 3, the through-holes of the electrodes 5 and 7 needed to be excessively large, and an area where the electrostatic and heater electrodes 5 and 7 were not formed became large. Accordingly, it was impossible to obtain a uniform distribution of electrostatic attraction force and heating density.

However, according to the embodiment, the electrostatic and heater electrodes 5 and 7 are formed by printing on the front and rear surfaces of the single alumina sintered body. The electrostatic and heater electrodes 5 and 7 can be therefore aligned very easily, and the insulation distance between the electrodes can be made very small, for example, 0.5 to 1 mm. This can provide a more uniform distribution of electrostatic attraction force and moreover increase the density of the heater electrode to improve the thermal uniformity of the heater.

4) In a conventional process of baking the alumina sintered body, the conductive material (W or WC) contained in the electrostatic electrode 5 might diffuse into the alumina powder 49 through the binder. In this case, the substantial volume resistivity of the dielectric layer 11 was reduced, thus causing degradation of the chucking and de-chucking response of a substrate. Moreover, when the dielectric layer 11 was thin, insulation breakdown might occur. Accordingly, the dielectric layer 11 needed to be thick. When the dielectric layer 11 was thick, high voltage needed to be applied to generate enough attraction force, and the control thereof was difficult.

However, according to the embodiment, the alumina sintered body with the conductive paste applied thereto is subjected to calcination, and the binder in the conductive paste evaporates into the outside atmosphere. The conductive material can be therefore prevented from diffusing into the alumina powder 49 through the binder. Accordingly, the dielectric layer 11 can have a substantially high volume resistivity, and the chucking and de-chucking response can be improved. Moreover, the dielectric layer 11 can be formed to have a small thickness of 0.1 to 0.2 mm, and the applied voltage can be set low.

5) Moreover, by calcining the granulated alumina powder in an oxidizing atmosphere at a temperature of not less than 450° C. in advance, the binder in the alumina powders 47 and 49 can be evaporated. Using the calcined alumina powder for forming can further prevent the diffusion of the conductive material in the conductive pastes 43 and 45.

EXAMPLES

Next, the present invention is concretely described using examples.

[Examination 1]

First, as Examination 1, the electrostatic electrode and heater electrode were formed on both sides of an alumina sintered body, and the alumina powder was arranged on the both sides of the alumina sintered body. These alumina powder and alumina sintered body were pressed and baked. Hereinafter, the details are described with reference to Table 1.
(Table 1)

TABLE 1

|  |  | Example 1 | Example 2 | Comparative Example 1 | Comparative Example 2 | Comparative Example 3 |
|---|---|---|---|---|---|---|
| Dielectric layer |  | powder | powder | Sintered body | Sintered body | Powder |
| Supporting member |  | Sintered body + powder | Sintered body + powder | Sintered body + powder | Green sheet + sintered bodies | Sintered body + powder |
| Electrode calcining temperature |  | 450° C. | 1000° C. | Not calcined | Not calcined | Not calcined |
| Average crystal particle size of dielectric layer |  | 4 µm | 4 µm | 12 µm | 12 µm | 4 µm |
| Volume resistivity of dielectric layer | RT | >1E+17 | >1E+17 | 1E+16 | 1E+16 | 9E+16 |
|  | 100° C. | 2E+16 | 8E+16 | 3E+14 | 3E+14 | 3E+15 |
|  | 200° C. | 1E+15 | 1E+16 | 1E+13 | 1E+13 | 1E+14 |
| Insulation voltage(V) |  | 18 | 20 | 21 | 21 | 14 |
| Average WC diffusion distance (µm) |  | 150 | 100 | 280 | 280 | 280 |
| WC diffusion area ratio (850 × 300 µm region) |  | 0.25 | 0.2 | 0.4 | 0.4 | 0.4 |
| Chucking and de-chucking response time (sec) | RT | <1 | <1 | <1 | <1 | <1 |
|  | 100° C. | <1 | <1 | 40 | 40 | 20 |
|  | 200° C. | 14 | 3 | >60 | >60 | 42 |
| Comprehensive evaluation |  | excellent | excellent | bad | bad | poor |

Example 1

First, an alumina sintered body which serves as the substrate layer 29 was prepared. The carbon content of the alumina sintered body was not more than 0.1 wt %. The relative density thereof was not less than 98%, and the purity thereof was not less than 95%. Sintering may be carried out either using hot pressing or at normal pressure. In this embodiment, the alumina sintered body was produced using hot pressing.

Subsequently, the electrostatic electrode and heater electrode were printed on the front and rear surfaces of the alumina sintered body, respectively. Specifically, slurry containing powder of tungsten carbide (WC) and a binder was applied to the both surfaces of the alumina sintered body and dried.

The alumina sintered body with the slurry applied thereto was subjected to calcination at a temperature of 450° C. in a non-oxidizing atmosphere to evaporate the binder in the slurry.

Alumina powder was accommodated in a mold, and the alumina sintered body was placed on the alumina powder. Alumina powder was then accommodated over the alumina sintered body. The alumina powder and alumina sintered body was pressed in this state, thus preparing the alumina body.

Finally, the thus prepared alumina body was subjected to pressure sintering using hot pressing (at 1600° C. for two hours), thus preparing a base of Example 1.

Example 2

Example 2 was produced under the same conditions and by the same method as those of the base of Example 1 described above except the calcining temperature, which was changed to 1000° C. in Example 2.

Comparative Example 1

First, an alumina sintered body as the dielectric layer was prepared using hot pressing. The carbon content of the alumina sintered body was not more than 0.1 wt %. The relative density thereof was not less than 98%, and the purity thereof was not less than 95%.

Subsequently, an electrostatic electrode was printed on the lower surface of the alumina sintered body specifically, slurry containing powder of tungsten carbide (WC) and a binder was applied to the lower surface of the alumina sintered body and then dried.

On the other hand, an alumina sintered body as the supporting layer was prepared. Slurry containing powder of tungsten (W) and a binder was applied to the upper surface of this alumina sintered body and dried to form a heater electrode.

These two alumina sintered bodies were arranged so that the electrostatic electrode and heater electrode faced to each other with alumina powder sandwiched therebetween. These alumina powder and alumina sintered bodies were pressed to produce an alumina body.

Finally, the obtained alumina body was sintered using hot pressing (for two hours at 1600° C.), thus preparing a base of Comparative Example 1.

Comparative Example 2

Comparative Example 2 was produced under the same conditions and by the same method as those of Comparative Example 1 described above except that a green sheet was sandwiched between the alumina sintered bodies.

Comparative Example 3

Comparative Example 3 was produced under the same conditions and by the same method as those of Comparative Example 1 described above except that the process of calcining the alumina sintered body with the electrostatic and heater electrodes formed thereon was omitted.

[Evaluation]

Figure 4:
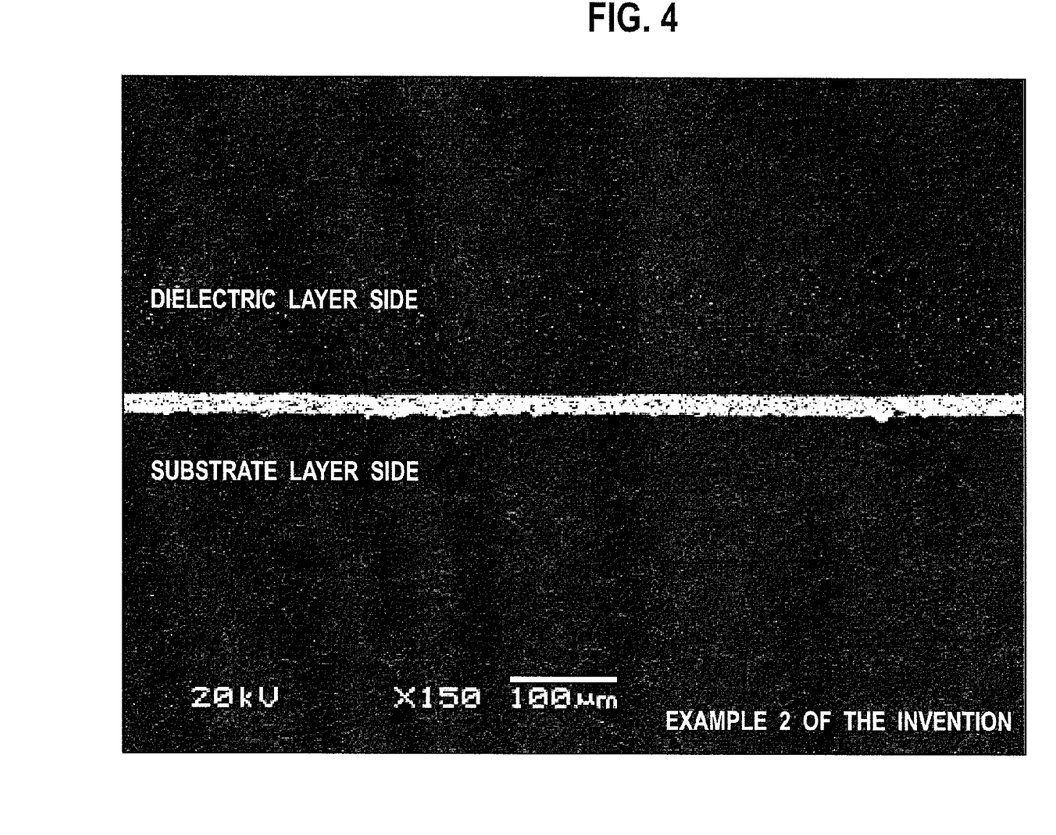
FIG. 4 is an electron micrograph (SEM micrograph, magnification: 150×) of an area around the boundary between a dielectric layer and a substrate layer in Example 2.

Example 2 and Comparative Example 1 were compared in terms of the diffusion degree of the tungsten carbide particles. FIG. 4 is an electron micrograph (SEM micrograph, magnification: 150×) of a region around the boundary between the dielectric layer and substrate layer in Example 2.

Figure 5:
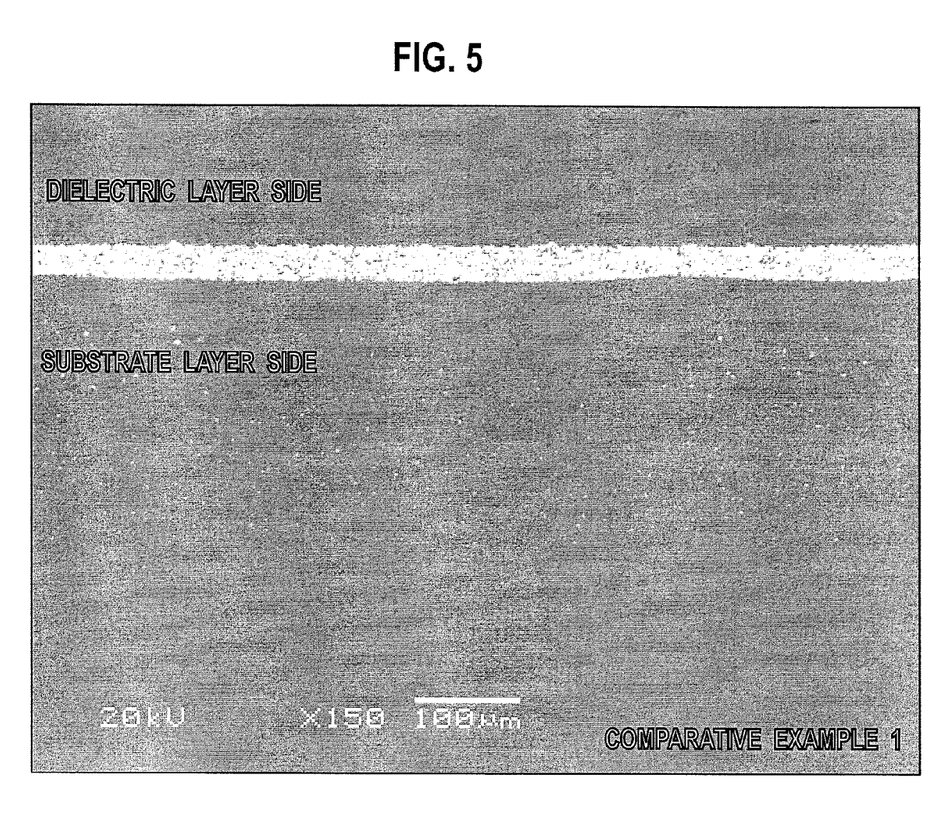
FIG. 5 is an electron micrograph (SEM micrograph, magnification: 150×) of an area around the boundary between a dielectric layer and a substrate layer in Comparative Example 1.

FIG. 5 is an electron micrograph (SEM micrograph, magnification: 150×) of a region around the boundary between the dielectric layer and substrate layer in Comparative Example 1.

cining temperature was set to room temperature (calcining was not carried out), 300, 400, 450, and 1000° C. The thickness of the dielectric layer was 0.4 mm.

Figure 8:
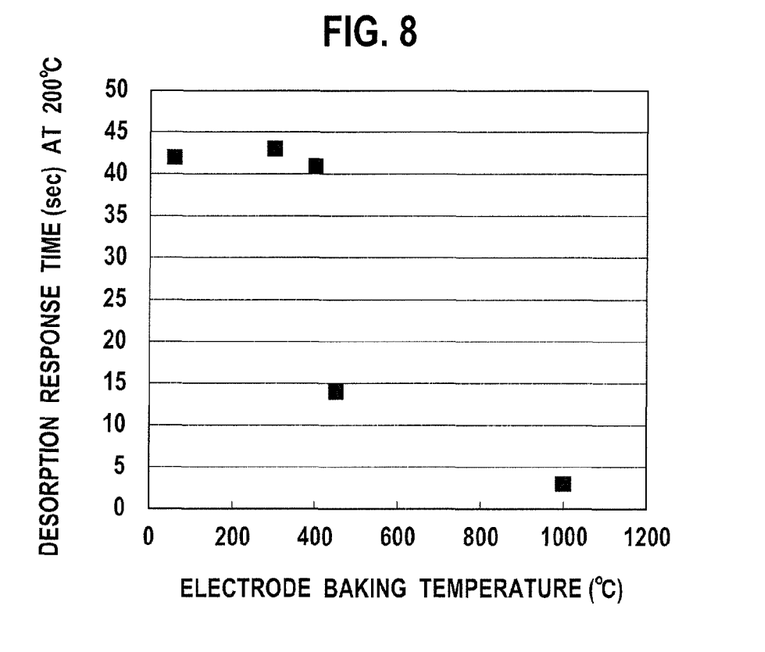
FIG. 8 is a graph showing a relation between calcining temperature and chucking/de-chucking response time of a substrate at 200° C.
Figure 9:
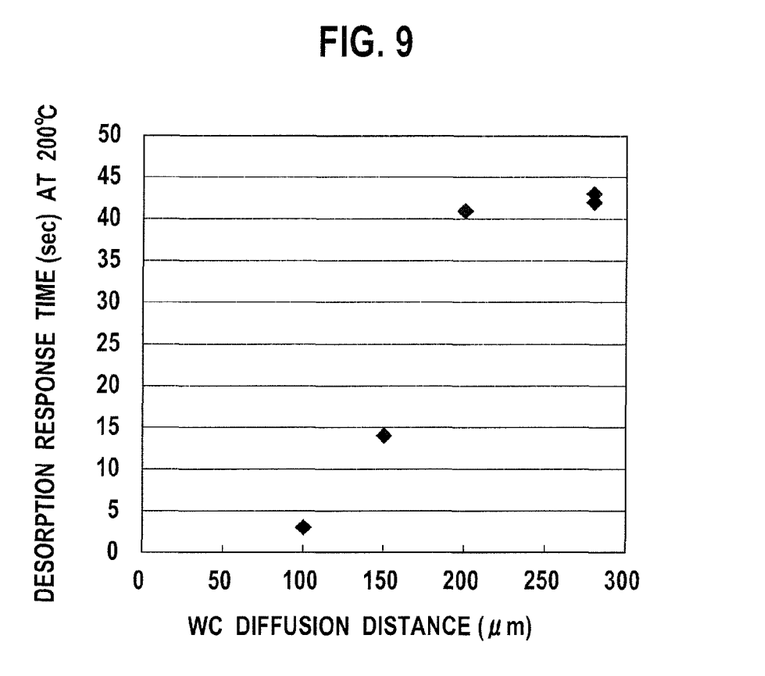
FIG. 9 is a graph showing a relation between diffusion distance of WC particles and the chucking/de-chucking response time of a substrate at 200° C.

FIG. 8 shows the chucking and de-chucking response time of a substrate at 200° C. relative to the calcining temperature. FIG. 9 shows the chucking and de-chucking response time of a substrate at 200° C. relative to the tungsten carbide particle diffusion distance.

(Table 2)

TABLE 2

| Electrode calcining temperature (° C.) | | Not calcined | 300 | 400 | 450 | 1000 |
|---|---|---|---|---|---|---|
| Average WC diffusion distance (μm) | | 280 | 280 | 200 | 150 | 100 |
| WC diffusion area ratio (850 × 300 μm region) | | 0.4 | 0.4 | 0.4 | 0.25 | 0.2 |
| Chucking and de-chucking response time (sec) | RT | <1 | <1 | <1 | <1 | <1 |
| | 100° C. | 20 | 21 | 19 | <1 | <1 |
| | 200° C. | 42 | 43 | 41 | 14 | 3 |

Figure 6:
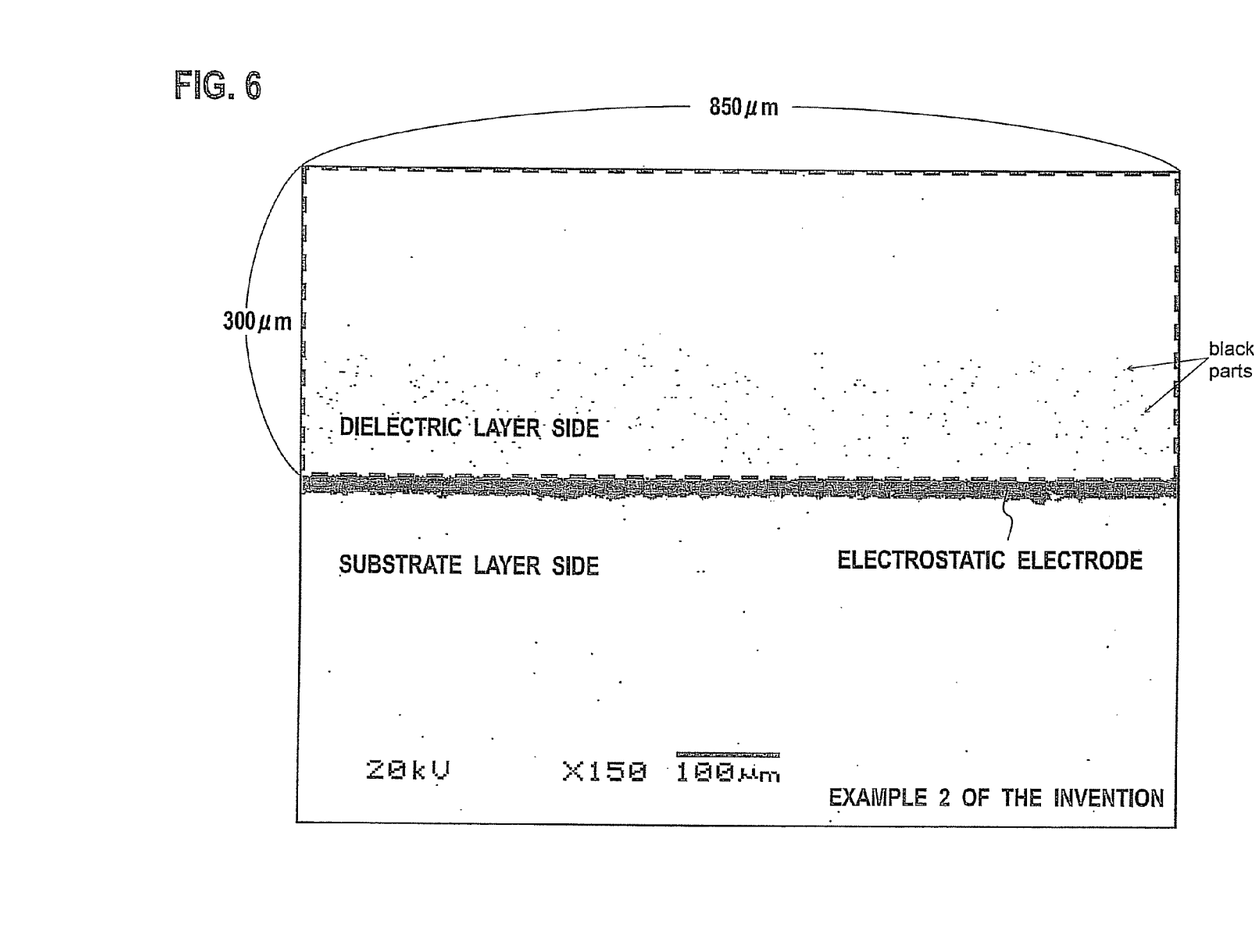
FIG. 6 shows image data obtained by transforming FIG. 4 into a binarized image, showing the diffusion degree of tungsten carbide particles (black parts) in a cross-sectional region of 300 μm by 850 μm in the dielectric layer.
Figure 7:
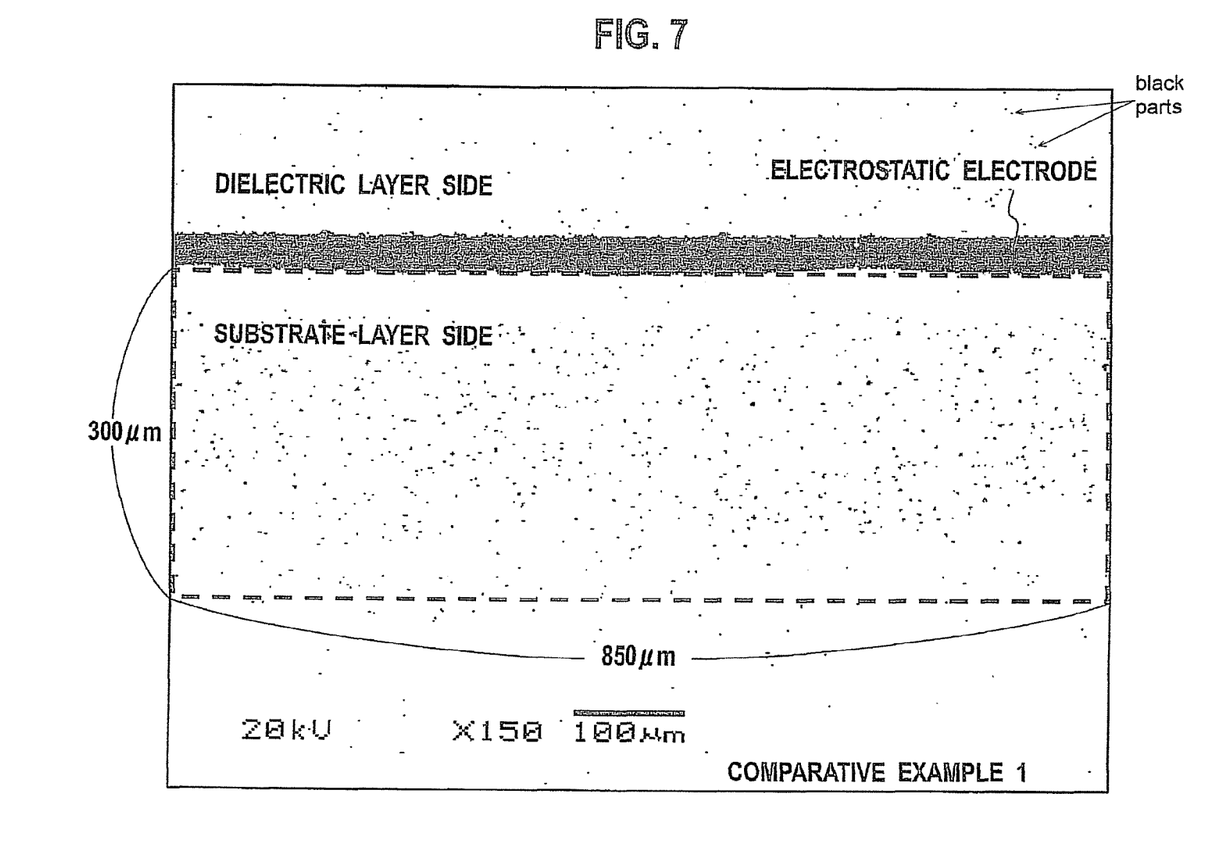
FIG. 7 shows image data obtained by binarizing FIG. 5, showing the diffusion degree of tungsten carbide particles (black parts) in a cross-sectional region of 300 μm by 850 μm in the supporting layer.

FIG. 6 shows image data obtained by binarizing FIG. 4, showing the diffusion degree of the tungsten carbide particles in a cross-sectional region of 300 μm by 850 μm in the dielectric layer. FIG. 7 shows image data obtained by binarizing FIG. 5, showing the diffusion degree of the tungsten carbide particles in a cross-sectional region of 300 μm by 850 μm in the substrate layer.

As shown in FIGS. 6 and 7, it was found that there were few tungsten particles diffused in Example 2 while there were many tungsten particles diffused in Comparative Example 1. This is also apparent from data of a WC diffusion area ratio shown in Table 1. Herein, the WC diffusion distance and the WC diffusion area ratio are defined as follows.

The WC diffusion distance is a distance between the electrostatic electrode and a tungsten carbide particle group farthest from the electrostatic electrode in the binarized image data.

The WC diffusion area ratio is a ratio of the black parts, which define a cross-section of the WC particles, to a cross-sectional region of 300 μm by 850 μm adjacent to the electrostatic electrode in the binarized image data. An 850 μm long side of the cross-sectional area was adjacent to the electrode. In the case the WC diffusion area ratio is set not more than 0.25%, chucking/de-chucking response time of a substrate becomes short remarkably even at high temperature.

The dielectric layers of Examples 1 and 2 had volume resistivities higher than those of Comparative Examples 1 and 2 as shown in Table 1. This is thought to be because alumina particle sizes in the dielectric layers of Examples 1 and 2 were smaller than those of Comparative Examples 1 and 2. In Examples 1 and 2, as described above, the dielectric resistivities of the dielectric layers were high especially at 100 and 200° C., and accordingly, time required to attach and detach a substrate was short at high temperature. Also in a comprehensive evaluation, Examples 1 and 2 were much better than Comparative Examples 1, 2 and 3.

[Examination 2]

In Examination 2, the calcining temperature was properly varied in preparing the alumina sintered body of Example 1 in Examination 1. Specifically, as shown in Table 2 below, the WC particles diffusion distance was measured when the cal-

[Evaluation]

FIGS. 8 and 9 and Table 2 revealed that, by setting the sintering temperature of the electrostatic electrode to 450 to 1000° C., the diffusion area ratio of tungsten carbide particles was reduced and that the time required to attach or detach a substrate could be shortened.

As apparent from the aforementioned examples, according to the present invention, it is possible to provide an electrostatic chuck heater excellent in substrate chucking and de-chucking response even at high temperature.

The invention claimed is:

1. An electrostatic chuck heater, comprising:
   a base composed of an alumina sintered body;
   an electrostatic electrode which is embedded in upper part of the base and contains a conductive material; and
   a heater electrode which is embedded in lower part of the base and contains a conductive material;
   wherein
   the base includes a dielectric layer between the electrostatic electrode and an upper surface of the base, a substrate layer between the electrostatic electrode and heater electrode, and a supporting layer between the heater electrode and a lower surface of the base;
   wherein a diffusion area ratio of the conductive material of the electrostatic electrode present in the dielectric layer near the electrostatic electrode is defined as a ratio of black parts, which define a cross-section of the conductive material of the electrostatic electrode in the dielectric layer, to a cross-sectional region defined as 850 μm along a surface of the electrostatic electrode and 300 μm along a depth direction of the dielectric layer in binarized image data, obtained by binarizing an electron micrograph taken at 150× magnification of a region proximate a boundary between the dielectric layer and the substrate layer; and
   wherein the diffusion area ratio of the conductive material of the electrostatic electrode present in the dielectric layer near the electrostatic electrode is set not more than 0.25% by applying a conductive paste containing a binder to an upper surface of the alumina sintered body defining the substrate layer to print the electrostatic electrode, applying a conductive paste containing a binder to a lower surface of the alumina sintered body to print the heater electrode, calcining the alumina sintered body, and pressing alumina powder and the alumina sintered body with the alumina powder placed above the electrostatic electrode and below the heater electrode.

2. The electrostatic chuck heater according to claim 1, wherein a calcining temperature of the alumina sintered body defining the substrate layer is set to not less than 450° C.

3. The electrostatic chuck heater according to claim 1, wherein the conductive material of the electrostatic electrode is any one of tungsten metal and tungsten carbide.

4. The electrostatic chuck heater according to claim 1, wherein the conductive material of the heater electrode is any one of tungsten metal and tungsten carbide.

* * * * *